(12) United States Patent
Hsiao et al.

(10) Patent No.: US 12,349,308 B2
(45) Date of Patent: Jul. 1, 2025

(54) WIRELESS CHARGING DEVICE

(71) Applicants: INVENTEC (PUDONG) TECHNOLOGY CORPORATION, Shanghai (CN); INVENTEC CORPORATION, Taipei (TW)

(72) Inventors: Chi-Cheng Hsiao, Taipei (TW); Hsin-Cheng Chu, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 216 days.

(21) Appl. No.: 18/235,337

(22) Filed: Aug. 17, 2023

(65) Prior Publication Data
US 2024/0414876 A1 Dec. 12, 2024

(30) Foreign Application Priority Data
Jun. 6, 2023 (CN) .......................... 202310663160.3

(51) Int. Cl.
*H05K 7/20* (2006.01)
*H02J 50/00* (2016.01)

(52) U.S. Cl.
CPC ........ *H05K 7/20172* (2013.01); *H02J 50/005* (2020.01); *H05K 7/20145* (2013.01)

(58) Field of Classification Search
CPC ...... H02J 50/10; H02J 50/005; H02J 7/00309; H02J 7/007192; H05K 7/20145; H05K 7/20136; H05K 7/20172; H05K 7/20909; H05K 5/0214; H05K 5/0213; H05K 1/0203; H05K 7/20863; H01F 38/14; H01F 27/085; H01F 27/2876; F24F 13/081; F24F 13/20; G06F 1/20
See application file for complete search history.

(56) References Cited

U.S. PATENT DOCUMENTS

| | | | | |
|---|---|---|---|---|
| 11,476,706 | B2* | 10/2022 | Pinkos | H02J 50/005 |
| 11,798,735 | B2* | 10/2023 | Chiu | H01F 27/327 |
| 2017/0047769 | A1* | 2/2017 | Kim | H02J 7/00309 |
| 2019/0014683 | A1* | 1/2019 | Han | H02J 50/10 |
| 2020/0212726 | A1* | 7/2020 | Hwang | H05K 7/209 |
| 2021/0167632 | A1* | 6/2021 | Burdenski | H02J 50/10 |
| 2021/0185854 | A1* | 6/2021 | Sui | H01F 27/085 |
| 2021/0345520 | A1* | 11/2021 | Los | H01F 27/38 |
| 2022/0302757 | A1* | 9/2022 | Pei | H02J 50/005 |
| 2022/0337089 | A1* | 10/2022 | Powell, Jr. | H01F 27/025 |

* cited by examiner

*Primary Examiner* — Mandeep S Buttar
(74) *Attorney, Agent, or Firm* — Maschoff Brennan

(57) ABSTRACT

A wireless charging device includes a casing, a wireless charging module, an air guide and a fan assembly. The casing has an interior space and an opening communicating with the interior space. The wireless charging module is disposed in the interior space. The wireless charging module has a through hole. The air guide is located in the interior space and penetrates through the through hole and the opening. The air guide and an inner surface of the opening are spaced apart from each other so as to form an inlet slot, the air guide has an inlet, a channel and an outlet, and the inlet communicates with the interior space through the channel, the outlet and the inlet slot. The fan assembly is disposed on the casing and drives air to pass through the inlet, the channel, the outlet and the inlet slot and enter into the interior space.

10 Claims, 3 Drawing Sheets

WIRELESS CHARGING DEVICE

CROSS-REFERENCE TO RELATED APPLICATIONS

This non-provisional application claims priority under 35 U.S.C. § 119(a) on Patent Application No(s). 202310663160.3 filed in China, Jun. 6, 2023, the entire contents of which are hereby incorporated by reference.

BACKGROUND OF THE INVENTION

Technical Field of the Invention

The invention relates a charging device, more particularly to a wireless charging device.

Description of the Related Art

As the development and progress of technology, mobile devices, such as smartphones or tablet computers, can be connected to the vehicle system through application programs (e.g., CarPlay). In order to let users not to worry about the power consumption of mobile devices, wireless chargers are further applied to the vehicles so that the mobile devices can be connected to the vehicle system through the application programs while placed on the wireless chargers for charging.

When a mobile device is placed on a wireless charger for charging, the wireless charger and the mobile device both generate heat. Under the influence of these two kinds of heat, the charging efficiency of the wireless charger may be reduced. Therefore, how to solve the aforementioned issue is one of the crucial topics in this field.

SUMMARY OF THE INVENTION

The invention provides a wireless charging device which is capable of preventing heat generated by itself and the mobile device from adversely affecting the charging efficiency.

One embodiment of the invention provides a wireless charging device. The wireless charging device is configured to charge at least one electronic device. The wireless charging device includes a casing, a wireless charging module, an air guide and a fan assembly. The casing has an interior space, an opening and a support surface. The opening communicates with the interior space, the support surface faces away from the interior space, and the support surface is configured for the electronic device to be placed thereon. The wireless charging module is disposed in the interior space and configured to correspond to the electronic device. The wireless charging module has a through hole. The air guide is disposed on the casing and at least partially located in the interior space and penetrates through the through hole of the wireless charging module and the opening of the casing. The air guide and an inner surface of the opening are spaced apart from each other by a distance so as to form an inlet slot, the air guide has an inlet, a channel and an outlet, and the inlet communicates with the interior space through the channel, the outlet and the inlet slot. The fan assembly is disposed on the casing and corresponds to the air guide. The fan assembly is configured to drive air to sequentially pass through the inlet, the channel and the outlet and then enter into the interior space through the inlet slot.

According to the wireless charging device as discussed in the above embodiment, the air guide is disposed on the casing and at least partially located in the interior space and penetrates through the through hole of the wireless charging module and the opening of the casing, and the air guide and the inner surface of the opening are spaced apart from each other by a distance so as to form an inlet slot, such that the inlet of the air guide can communicate with the interior space of the casing through the channel and the outlet of the air guide and the inlet slot. Therefore, the fan assembly disposed on the casing and corresponding to the air guide can drive external air to flow into the interior space through the inlet, the channel, the outlet of the air guide and the inlet slot. As a result, before external air enters into the channel through the inlet of the air guide from outside, the external air can take heat generated by the electronic device away. Also, after air flows out of the channel from the outlet of the air guide, air can flow into the interior space of the casing through the inlet slot for cooling the wireless charging module, thereby preventing heat generated by the electronic device and the wireless charging module from adversely affecting charging efficiency of the wireless charging device.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
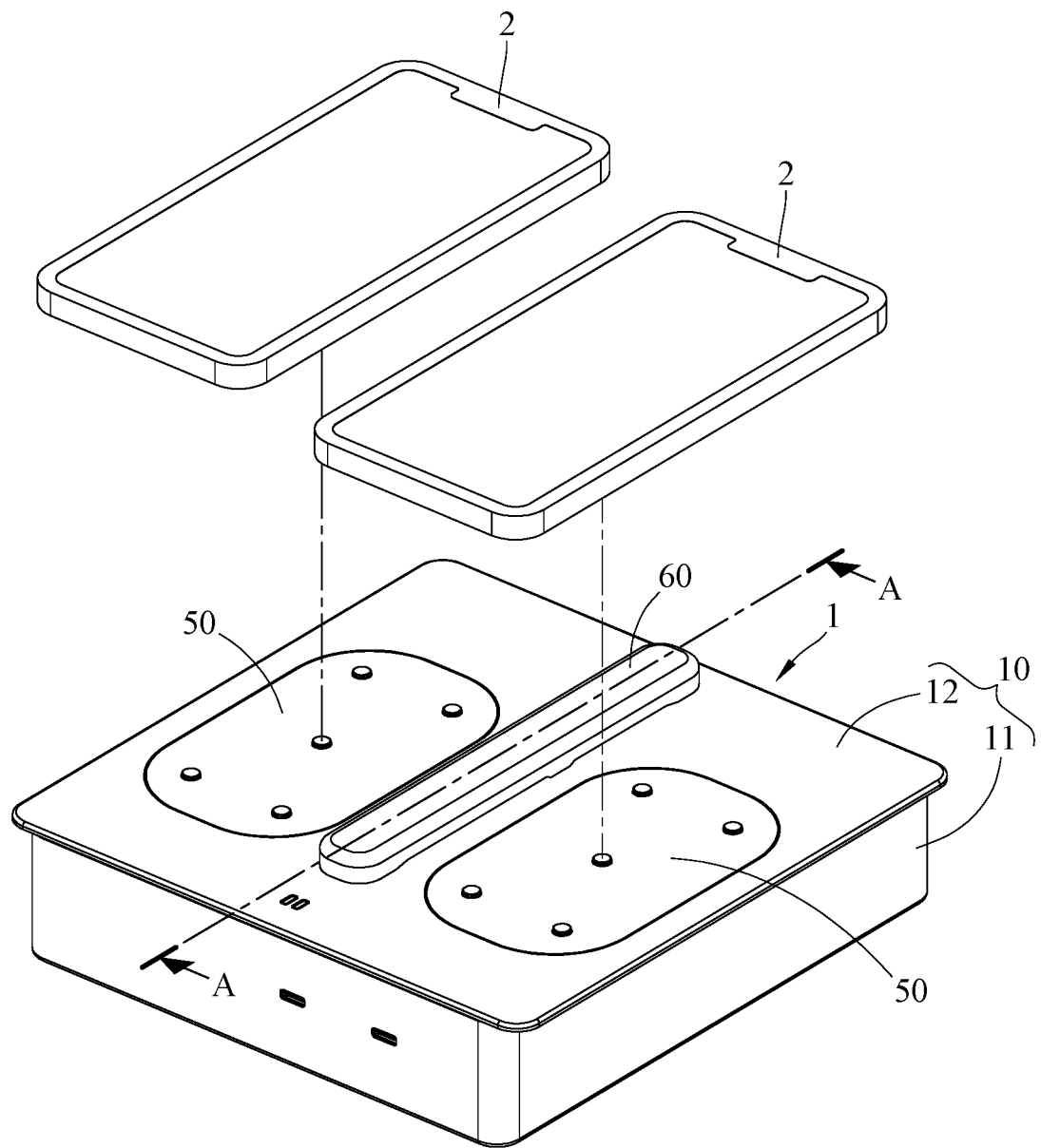
FIG. 1 is a perspective view of a wireless charging device and two electronic devices according to one embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

In addition, the terms used in the present invention, such as technical and scientific terms, have its own meanings and can be comprehended by those skilled in the art, unless the terms are additionally defined in the present invention. That is, the terms used in the following paragraphs should be read on the meaning commonly used in the related fields and will not be overly explained, unless the terms have a specific meaning in the present invention.

Figure 2:
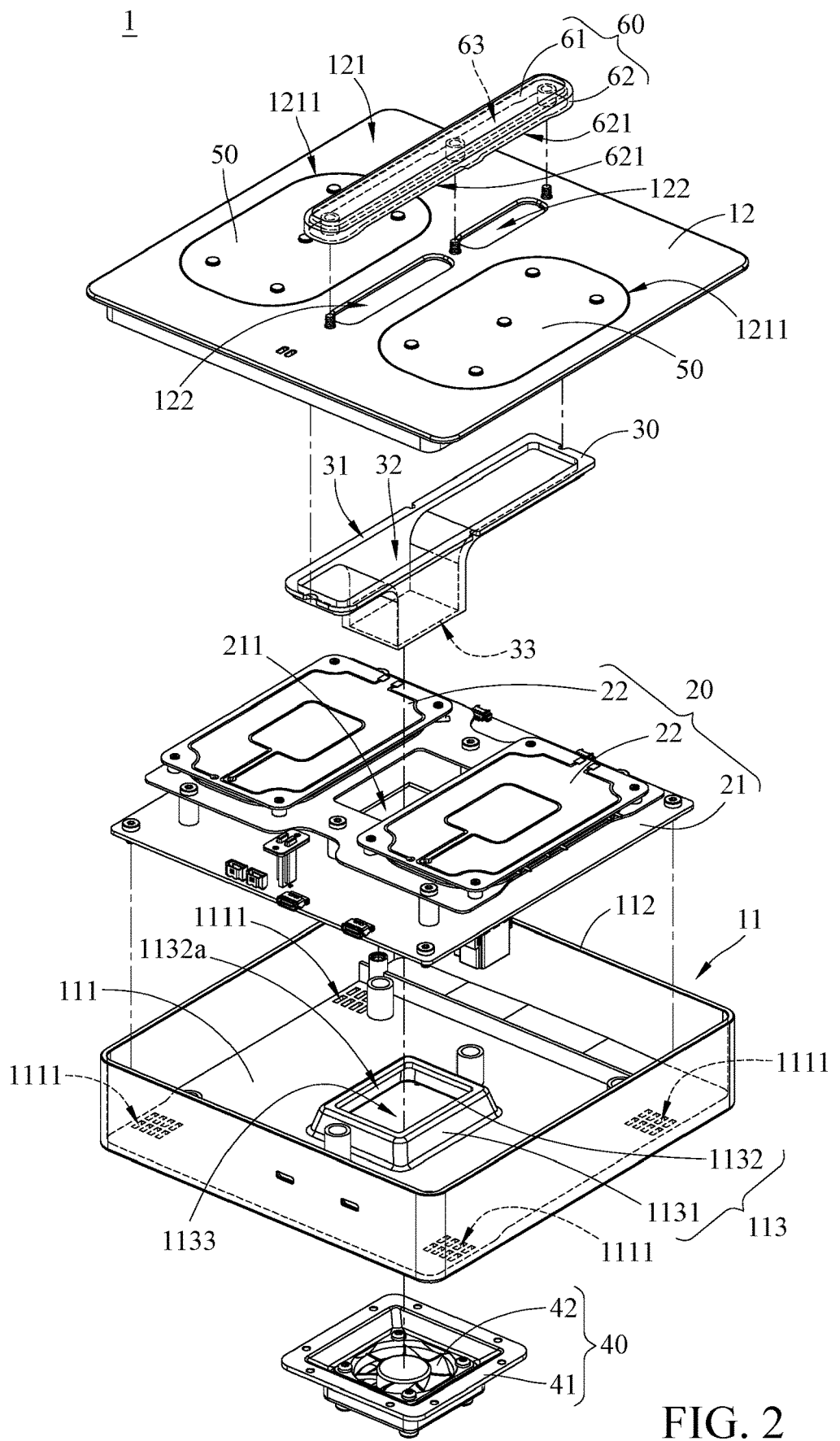
FIG. 2 is an exploded view of the wireless charging device in FIG. 1.
Figure 3:
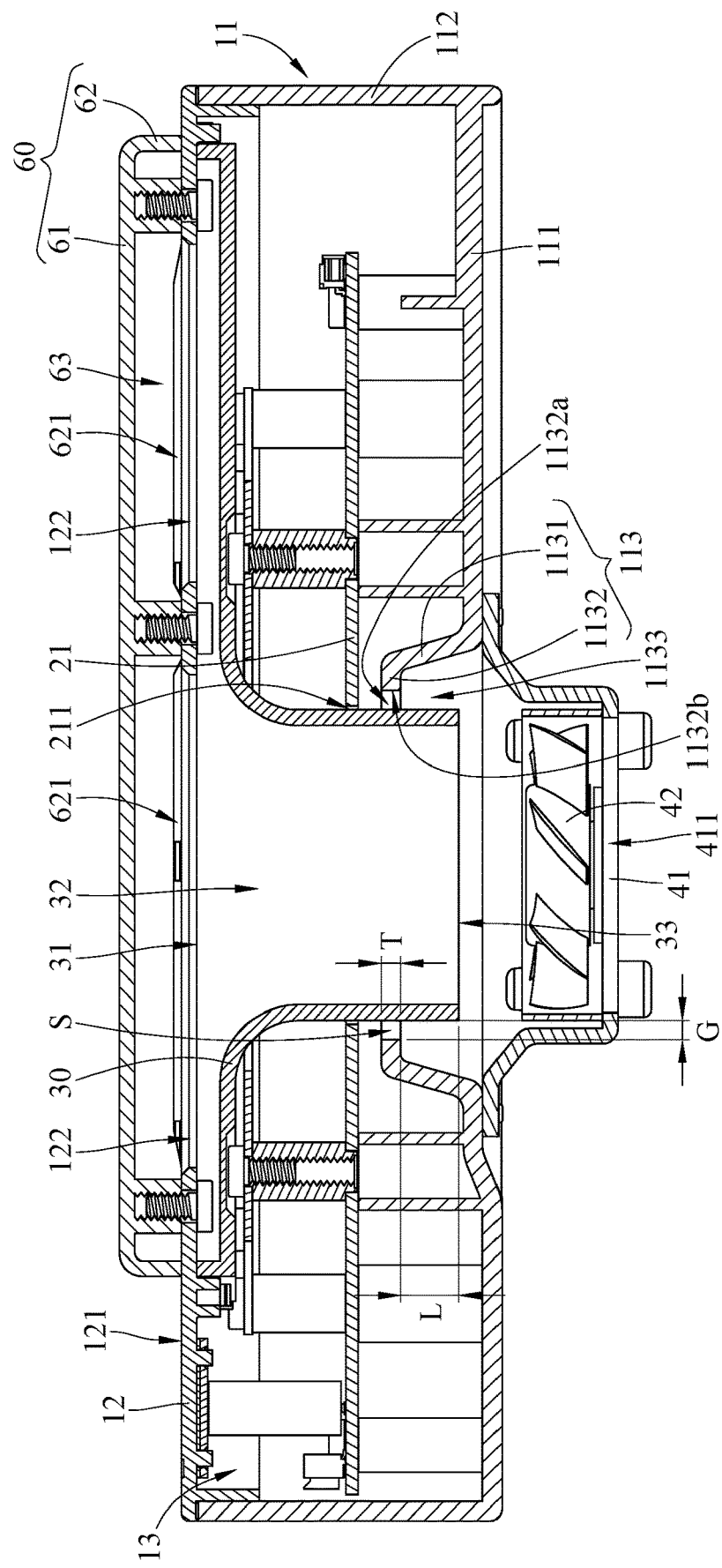
FIG. 3 is a cross-sectional view of the wireless charging device in FIG. 1 taken along a line A-A.

Referring to FIGS. 1 to 3, FIG. 1 is a perspective view of a wireless charging device 1 and two electronic devices 2 according to one embodiment of the invention, FIG. 2 is an exploded view of the wireless charging device 1 in FIG. 1, and FIG. 3 is a cross-sectional view of the wireless charging device 1 in FIG. 1 taken along a line A-A.

In this embodiment, the wireless charging device 1 can charge the two electronic devices 2, where the electronic devices 2 are, for example, smartphones. The wireless charging device 1 includes a casing 10, a wireless charging module 20, an air guide 30 and a fan assembly 40. In addition, the wireless charging device 1 may further include two support pads 50.

The casing 10 includes a base 11 and a cover 12, and the base 11 includes a bottom portion 111, a wall portion 112 and an inward recess portion 113. The wall portion 112 is connected to a periphery of the bottom portion 111, and the cover 12 is mounted on one side of the wall portion 112 located farther away from the bottom portion 111. The inward recess portion 113 includes an inclined part 1131 and a horizontal part 1132. One side of the inclined part 1131 is connected to the bottom portion 111, and the inclined part 1131 extends towards the cover 12. Another side of the inclined part 1131 is connected to the horizontal part 1132, and the inclined part 1131 is inclined relative to the bottom portion 111 and the horizontal part 1132. A thickness T of the horizontal part 1132 of the inward recess portion 113, for example, falls within a range from 1.5 mm to 3 mm.

In this embodiment, the cover 12, the bottom portion 111, the wall portion 112 and the inward recess portion 113 of the base 11 together form an interior space 13. The cover 12 has a support surface 121 and two vent holes 122. The support surface 121 faces away from the interior space 13 and has two placement areas 1211. The support pads 50 are respectively disposed on the placement areas 1211 of the support surface 121, and the support pads 50 are respectively configured to support the electronic devices 2. The vent holes 122 are located between the placement areas 1211 of the support surface 121 and communicate with the interior space 13. In addition, the bottom portion 111 of the base 11 has a plurality of air outlets 1111, and the air outlets 1111 communicate with the interior space 13. Moreover, the horizontal part 1132 has an opening 1132a, and the inclined part 1131 and the horizontal part 1132 together form a recess 1133. The recess 1133 communicates with the interior space 13 through the opening 1132a, and a width of the recess 1133 gradually increases along a direction away from the opening 1132a.

The wireless charging module 20 is located in the interior space 13 of the casing 10, and the wireless charging module 20 includes a circuit board 21 and two coil assemblies 22. The circuit board 21 has a through hole 211. The coil assemblies 22 are electrically connected to the circuit board 21, and the coil assemblies 22 respectively correspond to the placement areas 1211 of the support surface 121 for charging the electronic device 2 placed on the placement areas 1211.

The air guide 30 is fixed to the cover 12, and the air guide 30 extends towards the bottom portion 111 of the base 11 and penetrates through the through hole 211 of the circuit board 21 and the opening 1132a of the inward recess portion 113 of the base 11. A length L which the air guide 30 sticks out of the opening 1132a of the inward recess portion 113 of the base 11, for example, falls within a range from 5 mm to 10 mm, such as 7.5 mm. The air guide 30 and an inner surface 1132b of the opening 1132a of the inward recess portion 113 are spaced apart from each other by a distance G so as to form an inlet slot S, where the distance G, for example, falls within a range from 1.5 mm to 2.5 mm, such as 2.5 mm. The air guide 30 has an inlet 31, a channel 32 and an outlet 33. The vent holes 122 of the cover 12 communicate with the interior space 13 through the inlet 31, the channel 32 and the outlet 33 of the air guide 30, the recess 1133 and the inlet slot S.

Note that the quantity of the vent holes 122 of the cover 12 is not restricted in the invention; in some other embodiments, the cover may have only one vent hole. In addition, the vent holes 122 of the cover 12 are optional structures; in some other embodiments, the cover may have an installation opening, and the air guide may be disposed through the installation opening of the cover, such that the inlet of the air guide is located outside the interior space.

The fan assembly 40 includes a frame 41 and a fan 42. The frame 41 is fixed to the bottom portion 111 of the base 11 of the casing 10, and the frame 41 covers the recess 1133 formed by the inclined part 1131 and the horizontal part 1132. The frame 41 has an exhaust hole 411. The fan 42 is disposed on the frame 41, and two opposite sides of the fan 42 respectively correspond to the outlet 33 of the air guide 30 and the exhaust hole 411 of the frame 41.

In this embodiment, the wireless charging device 1 further comprises a baffle 60. The baffle 60 includes a cover portion 61 and an annular wall portion 62. The annular wall portion 62 is connected to a periphery of the cover portion 61. The annular wall portion 62 and the cover portion 61 together form a guide space 63. The annular wall portion 62 has a plurality of recesses 621 located at one side of the annular wall portion 62 which is located farther away from the cover portion 61. The annular wall portion 62 is in contact with the support surface 121 and located around the vent holes 122. The recesses 621 communicate with the inlet 31 through the guide space 63 and the vent holes 122.

When the electronic devices 2 are respectively placed on the support pads 50 located at the placement areas 1211 of the support surface 121, and the coil assemblies 22 respectively charge the electronic devices 2, the electronic devices 2 and the wireless charging module 20 may generate heat. The fan 42 in operation drives external air outside of the wireless charging device 1 to flow towards the recesses 621 of the baffle 60, such that air flowing through the electronic devices 2 can take heat generated by the electronic devices 2 away. Then, after air passes through the recesses 621, air sequentially flows through the guide space 63 of the baffle 60, the vent holes 122 of the cover 12, the inlet 31 and the channel 32 of the air guide 30 and reaches the outlet 33 of the air guide 30. Then, a part of air may be directly sucked out of the wireless charging device 1 from the exhaust hole 411 by the fan 442, and another part of air may enter into the interior space 13 through the recess 1133 of the base 11 and the inlet slot S for cooling the wireless charging module 20 and then flow out of the interior space 13 from the air outlet 1111 of the bottom portion 111 of the base 11.

In short, before external air enters into the wireless charging device 1, the external air can take heat generated by the electronic devices 2 away. Also, after air flows out of the channel 32 from the outlet 33, air can flow into the interior space 13 of the casing 10 through the inlet slot S for cooling the wireless charging module 20. Therefore, both of the electronic devices 2 and the wireless charging module 20 can be cooled by air, thereby preventing heat generated by the electronic devices 2 and the wireless charging module 20 from adversely affecting charging efficiency of the wireless charging device 1.

Moreover, the thickness T of the horizontal part 1132 of the inward recess portion 113 falls within a range from 1.5 mm to 3 mm, the length L that the air guide 30 sticks out of the opening 1132a of the inward recess portion 113 of the base 11 falls within a range from 5 mm to 10 mm, and the distance G between the air guide 30 and the inner surface 1132b of the opening 1132a of the inward recess portion 113 falls within a range from 1.5 mm to 2.5 mm; that is, the length L is about three times of the distance G; which can ensure external substance (e.g., liquid or dust) after passing through the baffle 60 and the air guide and reaching the fan 42 does not easily enter into the interior space 13 through the inlet slot S even if the external substance splashes due to the rotation of fan blades of the fan 42, thereby achieving both of the electronic devices 2 and the wireless charging module 20 to be cooled by air while maintaining the requirements of water and dust proof.

Note that the thickness T of the horizontal part 1132 of the inward recess portion 113, the length L that the air guide 30 sticks out of the opening 1132a of the inward recess portion 113 of the base 11, and the distance G between the air guide 30 and the inner surface 1132b of the opening 1132a of the inward recess portion 113 are not restricted to falling within the aforementioned ranges and may be modified as actual requirements.

In addition, the inclined part 1131 of the inward recess portion 113 of the base 11 is inclined relative to the horizontal part 1132 and the bottom portion 111, which can further ensure the external substance to uneasily enter into the interior space through the inlet slot S.

Note that the inward recess portion 113 is not restricted to including the inclined part 1131 and the horizontal part 1132; in some other embodiments, the inward recess portion may include a vertical part and a horizontal part, the vertical part is perpendicular to the horizontal part and the bottom portion, and thus a recess formed by the vertical part and the horizontal part has a uniform width. Moreover, the base 11 is not restricted to including the inward recess portion 113; in some other embodiments, the base may not have the inward recess portion, and the opening may be located at the bottom portion of the base.

In this embodiment, the baffle 60 can gather external air outside the wireless charging device 1, such that external air can effectively cool the electronic devices 2. Note that the baffle 60 is an optional component; in some other embodiments, the wireless charging device may be provided with another suitable structure for gathering external air.

Note that the wireless charging device 1 is not restricted to being capable of charging the two electronic device 2 simultaneously; in some other embodiments, the wireless charging module of the wireless charging device may include only one coil assembly for merely charging one electronic device.

According to the wireless charging device as discussed in the above embodiment, the air guide is disposed on the casing and at least partially located in the interior space and penetrates through the through hole of the wireless charging module and the opening of the casing, and the air guide and the inner surface of the opening are spaced apart from each other by a distance so as to form an inlet slot, such that the inlet of the air guide can communicate with the interior space of the casing through the channel and the outlet of the air guide and the inlet slot. Therefore, the fan assembly disposed on the casing and corresponding to the air guide can drive external air to flow into the interior space through the inlet, the channel, the outlet of the air guide and the inlet slot. As a result, before external air enters into the channel through the inlet of the air guide from outside, the external air can take heat generated by the electronic devices away. Also, after air flows out of the channel from the outlet of the air guide, air can flow into the interior space of the casing through the inlet slot for cooling the wireless charging module, thereby preventing heat generated by the electronic devices and the wireless charging module from adversely affecting charging efficiency of the wireless charging device.

Moreover, the thickness of the horizontal part of the inward recess portion falls within a range from 1.5 mm to 3 mm, the length that the air guide sticks out of the opening of the inward recess portion of the base falls within a range from 5 mm to 10 mm, and the distance between the air guide and the inner surface of the opening of the inward recess portion falls within a range from 1.5 mm to 2.5 mm, which can ensure external substance (e.g., liquid or dust) after passing through the baffle and the air guide and reaching the fan does not easily enter into the interior space through the inlet slot even if the external substance splashes due to the rotation of fan blades of the fan, thereby achieving both of the electronic devices and the wireless charging module to be cooled by air while maintaining the requirements of water and dust proof.

In addition, the inclined part of the inward recess portion of the base is inclined relative to the horizontal part and the bottom portion, which can further ensure the external substance to uneasily enter into the interior space through the inlet slot.

In one embodiment of the invention, the wireless charging device may be applied in a vehicle, such as self-driving vehicle, electric vehicle, or semi-self-driving vehicle.

It will be apparent to those skilled in the art that various modifications and variations can be made to the present invention. It is intended that the specification and examples be considered as exemplary embodiments only, with a scope of the invention being indicated by the following claims and their equivalents.

What is claimed is:

1. A wireless charging device, configured to charge at least one electronic device, comprising:
   a casing, having an interior space, an opening and a support surface, wherein the opening communicates with the interior space, the support surface faces away from the interior space, and the support surface is configured for the at least one electronic device to be placed thereon;
   a wireless charging module, disposed in the interior space and configured to correspond to the at least one electronic device, wherein the wireless charging module has a through hole;
   an air guide, disposed on the casing, at least partially located in the interior space and penetrating through the through hole of the wireless charging module and the opening of the casing, wherein the air guide and an inner surface of the opening are spaced apart from each other by a distance so as to form an inlet slot, the air guide has an inlet, a channel and an outlet, the inlet communicates with the interior space through the channel, the outlet and the inlet slot; and
   a fan assembly, disposed on the casing and corresponding to the air guide, wherein the fan assembly is configured to drive air to sequentially pass through the inlet, the channel and the outlet and then enter into the interior space through the inlet slot.

2. The wireless charging device according to claim 1, wherein the distance falls within a range from 1.5 mm to 2.5 mm.

3. The wireless charging device according to claim 1, wherein a length that the air guide sticks out of the opening falls within a range from 5 mm to 10 mm.

4. The wireless charging device according to claim 1, wherein the casing comprises a base and a cover, the base comprises a bottom portion, a wall portion and an inward recess portion, the wall portion is connected to a periphery of the bottom portion, the cover is mounted on one side of the wall portion located farther away from the bottom portion, the inward recess portion is connected to the bottom portion and extend towards the cover, the inward recess portion is surrounded by the wall portion, the base and the cover together form the interior space, the support surface is located at the cover, the opening is located at the inward recess portion, the air guide is fixed to the cover, the inward recess portion surrounds and forms a recess, and the channel communicates with the interior space through the outlet, the recess and the inlet slot.

5. The wireless charging device according to claim 4, wherein the inward recess portion comprises an inclined part and a horizontal part, two opposite sides of the inclined part are respectively connected to the bottom portion and the horizontal part, the inclined part is inclined relative to the bottom portion and the horizontal part, the inclined part and the horizontal part together form the recess, and the opening is located at the horizontal part.

6. The wireless charging device according to claim 5, wherein a thickness of the horizontal part of the inward recess portion falls within a range from 1.5 mm to 3 mm.

7. The wireless charging device according to claim 5, wherein a width of the recess gradually increases along a direction away from the opening.

8. The wireless charging device according to claim 4, wherein the fan assembly comprises a frame and a fan, the frame is fixed to the bottom portion and covers the recess, and the fan is disposed on the frame and corresponds to the outlet of the air guide.

9. The wireless charging device according to claim 1, further comprising a baffle, wherein the casing further has a vent hole, the vent hole is located at the support surface and communicates with the interior space, the baffle comprises a cover portion and an annular wall portion, the annular wall portion is connected to a periphery of the cover portion, the annular wall portion and the cover portion together form a guide space, the annular wall portion has at least one recess located at one side of the annular wall portion which is located farther away from the cover portion, the annular wall portion is in contact with the support surface and located around the vent hole, and the at least one recess communicates with the inlet through the guide space and the vent hole.

10. The wireless charging device according to claim 1, further comprising at least one support pad, wherein the at least one support pad is disposed on the support surface and configured to support the at least one electronic device.

* * * * *